(12) United States Patent
Kim (10) Patent No.: US 7,573,951 B2
(45) Date of Patent: Aug. 11, 2009

(54) BINARY ARITHMETIC DECODING APPARATUS AND METHODS USING A PIPELINED STRUCTURE

(75) Inventor: Ji-Hak Kim, Inchon-si (KR)

(73) Assignee: Samsung Electronics Co., Ltd. (KR)

( * ) Notice: Subject to any disclaimer, the term of this patent is extended or adjusted under 35 U.S.C. 154(b) by 646 days.

(21) Appl. No.: 11/179,137

(22) Filed: Jul. 12, 2005

(65) Prior Publication Data

US 2006/0023795 A1 Feb. 2, 2006

(30) Foreign Application Priority Data

Aug. 2, 2004 (KR) .................. 10-2004-0060813

(51) Int. Cl.
*H03K 9/00* (2006.01)
*H04L 27/00* (2006.01)
*H04B 14/04* (2006.01)

(52) U.S. Cl. .................. 375/316; 375/242; 375/240.03

(58) Field of Classification Search ................ 375/242, 375/240.03; 341/143; 704/212
See application file for complete search history.

(56) References Cited

U.S. PATENT DOCUMENTS

| | | | | | |
|---|---|---|---|---|---|
| 4,295,125 | A | * | 10/1981 | Langdon, Jr. ................. | 341/50 |
| 4,899,143 | A | * | 2/1990 | Gopinath et al. ............. | 370/229 |
| 5,612,829 | A | * | 3/1997 | Takai et al. .................... | 360/54 |
| 5,892,466 | A | * | 4/1999 | Walker ......................... | 341/57 |
| 7,336,711 | B2 | * | 2/2008 | Kobayashi et al. ..... | 375/240.23 |
| 2002/0175839 | A1 | | 11/2002 | Frey | |
| 2004/0056787 | A1 | | 3/2004 | Bossen | |

FOREIGN PATENT DOCUMENTS

| | | |
|---|---|---|
| JP | 2001-136524 | 5/2001 |
| JP | 2002-033925 | 1/2002 |

(Continued)

OTHER PUBLICATIONS

Marpe et al, "Context-Based Adaptive Binary Arithmetic Coding in the H.264/AVC Video Compression Standard," IEEE Transactions on Circuits and Systems for Video Technology, vol. 13, No. 7, Jul. 2003, pp. 620-663.*

(Continued)

*Primary Examiner*—David C Payne
*Assistant Examiner*—Brian J Stevens
(74) *Attorney, Agent, or Firm*—Myers Bigel Sibley & Sajovec, P.A.

(57) ABSTRACT

Binary arithmetic decoding methods and apparatus are provided. A first decoded bit and a first set of decoding parameters are generated using a previously generated set of decoding parameters. A second decoded bit and a second set of decoding parameters are generated using the first set of decoding parameters. If the first decoded bit is a last bit of a syntax element, the second set of decoding parameters is disregarded in generating subsequent decoded bits. The generation of the first and second decoded bits and determination of whether the first decoded bit is a last bit of a syntax element, e.g., a de-binarizing operation, may be pipelined such that the determination of whether the first decoded bit is a last bit of a syntax element occurs concurrent with and/or after generation of the second decoded bit and the second set of decoding parameters.

28 Claims, 9 Drawing Sheets

FOREIGN PATENT DOCUMENTS

| | | |
|---|---|---|
| JP | 2003-319391 | 11/2003 |
| KR | 10-2003-7015954 | 4/2004 |

OTHER PUBLICATIONS

Marpe et al, "Context-Based Adaptive Binary Arithmetic Coding in the H.264/AVC Video Compression Standard," IEEE Transactions on Circuits and Systems for Video Technology, vol. 13, No. 7, Jul. 2003, pp. 620-663.*

Marpe et al., "Context-Based Adaptive Binary Arithmetic Coding in the H.264/AVC Video Compression Standard," IEEE Transactions on Circuits and Systems for Video Technology, vol. 13, No. 7, Jul. 2003, pp. 620-636.

Tarui et al., "High-Speed Implementation of JBIG Arithmetic Coder," TENCON 99. Proceedings of the IEEE Region 10 Conference Cheju Island, South Korea, Sep. 15-17, 1999, vol. 2, pp. 1291-1294.

Osorio et al., "New Arithmetic Coder/Decoder Architectures Based on Pipelining," Application-Specific Systems, Architectures and Processors, IEEE International Conference on Zurich, Switzerland, Jul. 14-16, 1997, pp. 106-115.

Pennebaker et al., "An overview of the basic principles of the Q-Coder adaptive binary arithmetic coder," IBM J. Res. Develop., vol. 32, No. 6, Nov. 1988, pp. 717-726.

Langdon, Jr., "An Introduction to Arithmetic Coding," IBM J. Res. Develop., vol. 28, No. 2, Mar. 1984, pp. 135-149.

* cited by examiner

BINARY ARITHMETIC DECODING APPARATUS AND METHODS USING A PIPELINED STRUCTURE

CROSS-REFERENCE TO RELATED APPLICATIONS

This U.S. non-provisional patent application claims priority under 35 U.S.C. § 119 of Korean Patent Application 2004-60813 filed on Aug. 2, 2004, the entire contents of which are hereby incorporated by reference.

BACKGROUND OF THE INVENTION

The present invention relates to data compression methods and apparatus and, more particularly, to arithmetic decoding methods and apparatus.

It is becoming increasingly desirable for video processing equipment to support high quality video applications and multimedia services. Generally, the amount of data video apparatus must process in a given time is increasing. This has led to an ongoing demand for new technologies for high-speed compression and decompression of video data.

Conventional video data compression techniques include H.261, H.262, H.263, and others techniques specified by the International Telecommunication Union (ITU), and MPEG-1, MPEG-2, MPEG-4, and other techniques specified by the Motion Picture Experts Group (MPEG) of the International Organization for Standardization (ISO). Recently, H.264 and MPEG-4 part 10 AVC, which include a high compression rate, have been developed by a joint video team of ITU and ISO. H.264 is being actively developed as a video data compression technology of the next generation in spite of its complexity and general difficulty in implementation, because it offers potentially higher compression rates and adaptability to various network circumstances.

The H.264 standard defines three profiles, including a baseline profile, a main profile, and an extended profile. The profiles use different compression and restoration schemes. The baseline profile compresses video data by entropy coding based on Context-Adaptive Variable Length Coding (CAVLC). The main profile defines characteristics of devices for processing high quality video data, such as HD television. The main profile compresses video data by entropy coding based on Context-Based Adaptive Binary Arithmetic Coding (CABAC). CABAC can achieve good compression performance by using probability estimation and an arithmetic coding scheme based on a probability model selection and statistics of each syntax element depending on a context for each bit.

Figure 1:
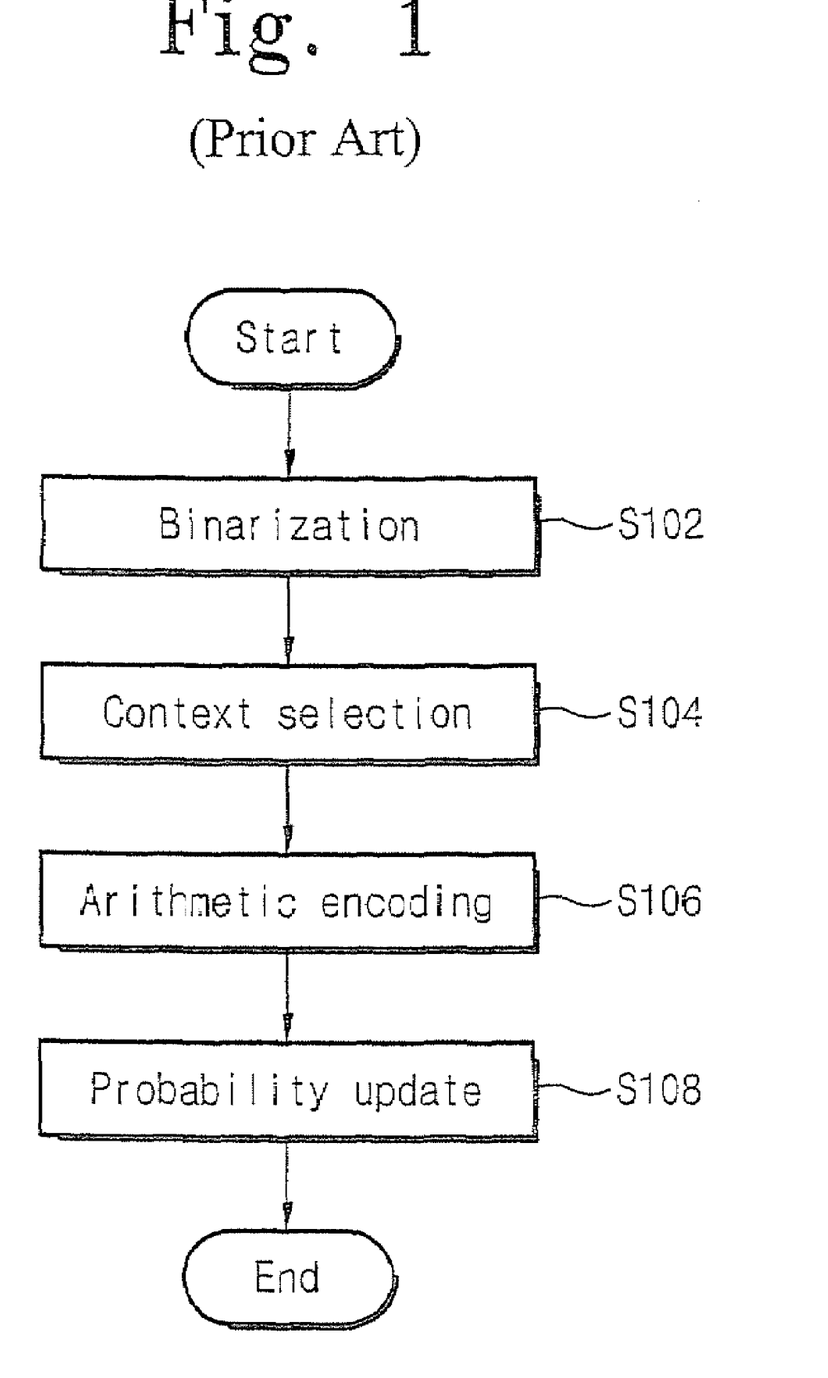
FIG. 1 is a flowchart illustrating a conventional data compression process based on context-based adaptive binary arithmetic coding (CABAC) according to the H.264 standard.

FIG. 1 is a flowchart illustrating a data compression process based on CABAC according to H.264 standard. The data compression process includes a binarization step S102, a context model selection step S104, an arithmetic encoding step S106, and a probability update step S108. In the binarization step S102, syntax elements having non-binary-values, e.g., transform coefficients or motion vectors, are binarized prior to arithmetic coding because, as described above, CABAC uses binary arithmetic coding, which means that binary decisions ('0' and '1') are encoded. In the context model selection step S104, a context model is selected for each binarized bit. The context model is a probability model for each bit of the binarized syntax element. The model for a bit is chosen from a selection of available models depending on the statistics of the recently coded syntax element. The context models represent the relative probabilities of each bit being a "1" or "0." In the arithmetic encoding step S106, an arithmetic coder encodes each bit according to the associated selected probability model. In the probability update step S108, the selected context model is updated based on the actual coded value.

Figure 2:
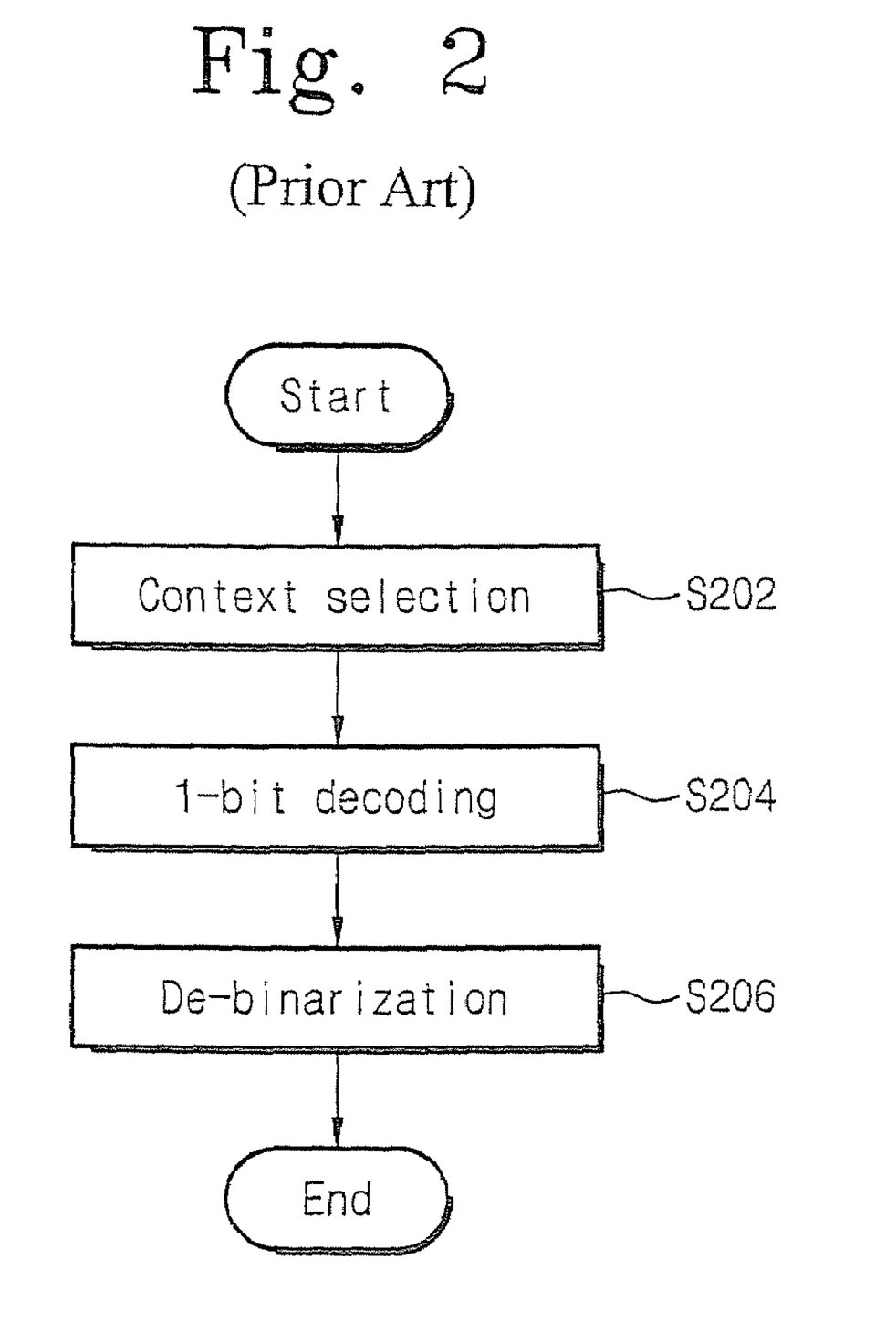
FIG. 2 is a flowchart illustrating a conventional data restoration process based on CABAC according to the H.264 standard.

Data compressed through the process illustrated in FIG. 1 is decoded (restored) by a CABAC decoder. FIG. 2 is a flowchart illustrating a data restoration process in a CABAC decoder. As shown in FIG. 2, the data restoration process includes a context selection step S202, a 1-bit decoding step S204, and a de-binarization step S206. In the context selection step S202, a context used for decoding in an arithmetic decoder is chosen. Then, in the 1-bit decoding step S204, a decoded bit is generated using the selected context and decoding parameters (e.g. value, range) generated during a decoding process for a previously generated decoded bit. In the de-binarization step S206, original syntax elements are restored by determining if the bit decoded in the decoding step is the last bit of the syntax element.

According to the H.264 standard, video data is compressed and restored through the steps in FIGS. 1 and 2. As described referring to FIG. 2, binary coded data are decoded sequentially one bit at a time, that is, after decoding for a current bit is completed, decoding for the next bit begins. The length of syntax elements is variable, not constant. Therefore, it may not be possible to determine whether the next bit belongs to a current syntax element or to the next syntax element before the de-binarization for a current bit is completed. Consequently, it may be difficult to perform CABAC decoding at a high processing speed. Further, the 1-bit decoding step may include a re-normalization, the duration of which is generally variable, and which can further delay processing. Potential problems in a conventional H.264 decoding process as described above may make it difficult to implement a high-speed CABAC decoder having high data processing rate.

SUMMARY OF THE INVENTION

In some embodiments of the present invention, binary arithmetic decoding methods are provided. A first decoded bit and a first set of decoding parameters are generated using a previously generated set of decoding parameters. A second decoded bit and a second set of decoding parameters are generated using the first set of decoding parameters. If the first decoded bit is a last bit of a syntax element, the second set of decoding parameters is disregarded in generating subsequent decoded bits. The generation of the first and second decoded bits and determination of whether the first decoded bit is a last bit of a syntax element, e.g., a de-binarizing operation, may be pipelined such that the determination of whether the first decoded bit is a last bit of a syntax element occurs concurrent with and/or after generation of the second decoded bit and the second set of decoding parameters. Disregarding the second set of decoding parameters in generating subsequent decoded bits if the first decoded bit is a last bit of a syntax element may include not using a context and a decoding interval determined in generating the second decoded bit in generating the subsequent decoded bits, and instead using decoding interval parameters from the first set of decoding parameters to generate a third decoded bit if the first decoded bit is a last bit of a syntax element.

According to further embodiments of the present invention, the first and second sets of decoding parameters may include respective first and second contexts and respective first and second decoding interval parameters. The first and second decoding interval parameters may include respective first and second sets of value and range parameters.

Generation of the first decoded bit and the first set of decoding parameters and/or generation of the second decoded bit and the second set of decoding parameters may include re-normalizing the first set of range and value parameters and/or the second set of range and value parameters. Re-normalizing may include generating a first binary value indicative of a number of times a binary "1" appears in a least significant b bits of a first range parameter, generating a second binary value indicative of a bit position at which a binary "1" appears with respect to a least significant bit of the first range parameter, generating a sum of the first and second binary values, shifting the first range parameter by the sum of the first and second binary values to generate a second range parameter, and shifting a first value parameter by the sum of the first and second binary values to generate a second value parameter.

In further embodiments, generating a first decoded bit and a first set of decoding parameters using a previously generated set of decoding parameters includes generating a first plurality of decoded bits and a first plurality of sets of decoding parameters. Generating a second decoded bit and a second set of decoding parameters using the first set of decoding parameters includes generating a second plurality of decoded bits and a second plurality of sets of decoding parameters. Determining whether the first decoded bit is a last bit of a syntax element includes determining whether one of the first plurality of decoded bits is a last bit of a syntax element. Disregarding the second set of decoding parameters in generating subsequent decoded bits if the first decoded bit is a last bit of a syntax element includes disregarding at least one of the second plurality of sets of decoding parameters in generating subsequent decoded bits if the one of the first plurality of decoded bits is a last bit of a syntax element. The generation of the first and second pluralities of decoded bits and the determination of whether one of the first plurality of decoded bits is a last bit of a syntax element may be pipelined such that the determination of whether one of the first plurality of decoded bits is a last bit of a syntax element occurs concurrent with and/or after generation of the second plurality of decoded bits and the second plurality of sets of decoding parameters. The sets of decoding parameters may each include a decoding interval parameter, e.g., the sets of decoding parameters may each include a value parameter and a range parameter, and the sets of decoding parameters may not include contexts.

According to other embodiments of the present invention, an apparatus includes a binary arithmetic decoder configured to recover syntax elements from a coded bitstream. The binary arithmetic decoder is configured to generate a first decoded bit and a corresponding set of decoding parameters using a previously generated set of decoding parameters and to generate a second decoded bit and a corresponding second set of decoding parameters using the first set of decoding parameters, and is further configured to determine whether the first decoded bit is a last bit of a syntax element and to disregard the second set of decoding parameters in generating subsequent decoded bits if the first decoded bit is a last bit of a syntax element.

The binary arithmetic decoder may include a context-adaptive binary arithmetic coding (CABAC) decoder configured to not use a context and a decoding interval determined in generating the second decoded bit in generating the subsequent decoded bits if the first decoded bit is a last bit of a syntax element. The CABAC decoder may be further configured to use decoding interval parameters from the first set of decoding parameters to generate a third decoded bit if the first decoded bit is a last bit of a syntax element.

The first and second sets of decoding parameters may include respective first and second decoding contexts and respective first and second decoding interval parameters. The CABAC decoder may include: a register configured to store contexts and decoding interval parameters; a context selector configured to receive contexts from the register, to store the received contexts and to select from among the stored contexts responsive to a syntax element indicator signal; an arithmetic decoder configured to receive the selected contexts from the context selector and decoding interval parameters from the register, to receive a data stream and generate decoded bits therefrom according to the selected contexts and the received decoding interval parameters and to generate respective sets including a context and a decoding interval parameter for the respective decoded bits; a de-binarizer configured to receive the decoded bits, to convert the decoded bits to syntax elements, and to generate a last bit indicator signal indicative of whether a decoded bit is a last bit of a syntax element; and a controller configured to receive the generated sets of a context and a decoding interval parameter for the respective decoded bits and the last bit indicator signal and to selectively store the contexts and decoding interval parameters in the register responsive to the last bit indicator signal.

The first and second sets of decoding parameters may include respective first and second sets of range and value parameters, and the arithmetic decoder may include a re-normalizer configured to re-normalize the first set of range and value parameters and/or the second set of range and value parameters. The re-normalizer may include: a first detector configured to generate a first binary value indicative of a number of times a binary "1" occurs in a least significant b bits of a first range parameter; a second detector configured to generate a second binary value indicative of a bit position at which a binary "1" appears with respect to a least significant bit of the first range parameter; an adder configured to generate a sum of the first and second binary values; a first shift register configured to shift the first range parameter by the sum of the first and second binary values to generate a second range parameter; and a second shift register configured to shift a first value parameter by the sum of the first and second binary values to generate a second value parameter. The re-normalizer may generate the second range parameter and the second value parameter by shifting the first range parameter and the first value parameter x bits according to the relation:

$$x = \log_2(2^{b-2}/\text{range}) + 1 = b - 1 - \text{round}(\log_2 \text{range}),$$

wherein b is a constant and range is the first range parameter.

In still further embodiments, the binary arithmetic decoder is configured to generate a first plurality of decoded bits and a corresponding first plurality of sets of decoding parameters and to generate a second plurality of decoded bits and a corresponding second set of decoding parameters using the first set of decoding parameters. The binary arithmetic decoder is further configured to determine whether one of the first plurality of decoded bits is a last bit of a syntax element and to disregard at least one of the second plurality of sets of decoding parameters in generating subsequent decoded bits if the one of the first plurality of decoded bits is a last bit of a syntax element. The binary arithmetic decoder may include a chain of arithmetic decoders, each of which is configured to pass a set of decoding parameters to a next arithmetic decoder of the chain, and a multi-bit de-binarizer configured to receive a plurality of decoded bits from the chain of arithmetic decoders.

According to additional embodiments of the present invention, an arithmetic decoder includes a decoder configured to generate a first range parameter and a first value parameter from an arithmetically-coded input data stream and a re-normalizer configured to generate re-normalized second range and value parameters from the first range and value parameters based on a number of times a binary "1" occurs in a least significant b bits of the first range parameter and a bit position at which a binary "1" appears with respect to a least significant bit of the first range parameter. The re-normalizer may include: a first detector configured to generate a first binary value indicative of a number of times a binary "1" occurs in a least significant b bits of the first range parameter; a second detector configured to generate a second binary value indicative of a bit position at which a binary "1" appears with respect to a least significant bit of the first range parameter; an adder configured to generate a sum of the first and second binary values; a first shift register configured to shift the first range parameter by the sum of the first and second binary values to generate the second range parameter; and a second shift register configured to shift the first value parameter by the sum of the first and second binary values to generate the second value parameter. The re-normalizer may generate the second range parameter and the second value parameter by shifting the first range parameter and the first value parameter x bits according to the relation:

$$x = \log_2(2^{b-2}/\text{range}) + 1 = b - 1 - \text{round}(\log_2 \text{range}),$$

wherein b is a constant and range is the first range parameter.

DETAILED DESCRIPTION OF EXEMPLARY EMBODIMENTS

Specific exemplary embodiments of the invention now will be described with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present. Furthermore, "connected" or "coupled" as used herein may include wirelessly connected or coupled.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "includes," "including" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will be understood that although the terms first and second are used herein to describe various elements, these elements should not be limited by these terms. These terms are only used to distinguish one element from another element. Thus, a first item could be termed a second item, and similarly, a second item may be termed a first item without departing from the teachings of the present invention. As used herein, the term "and/or" includes any and all combinations of one or more of the associated listed items. The symbol "/" may also used as a shorthand notation for "and/or".

Figure 3:
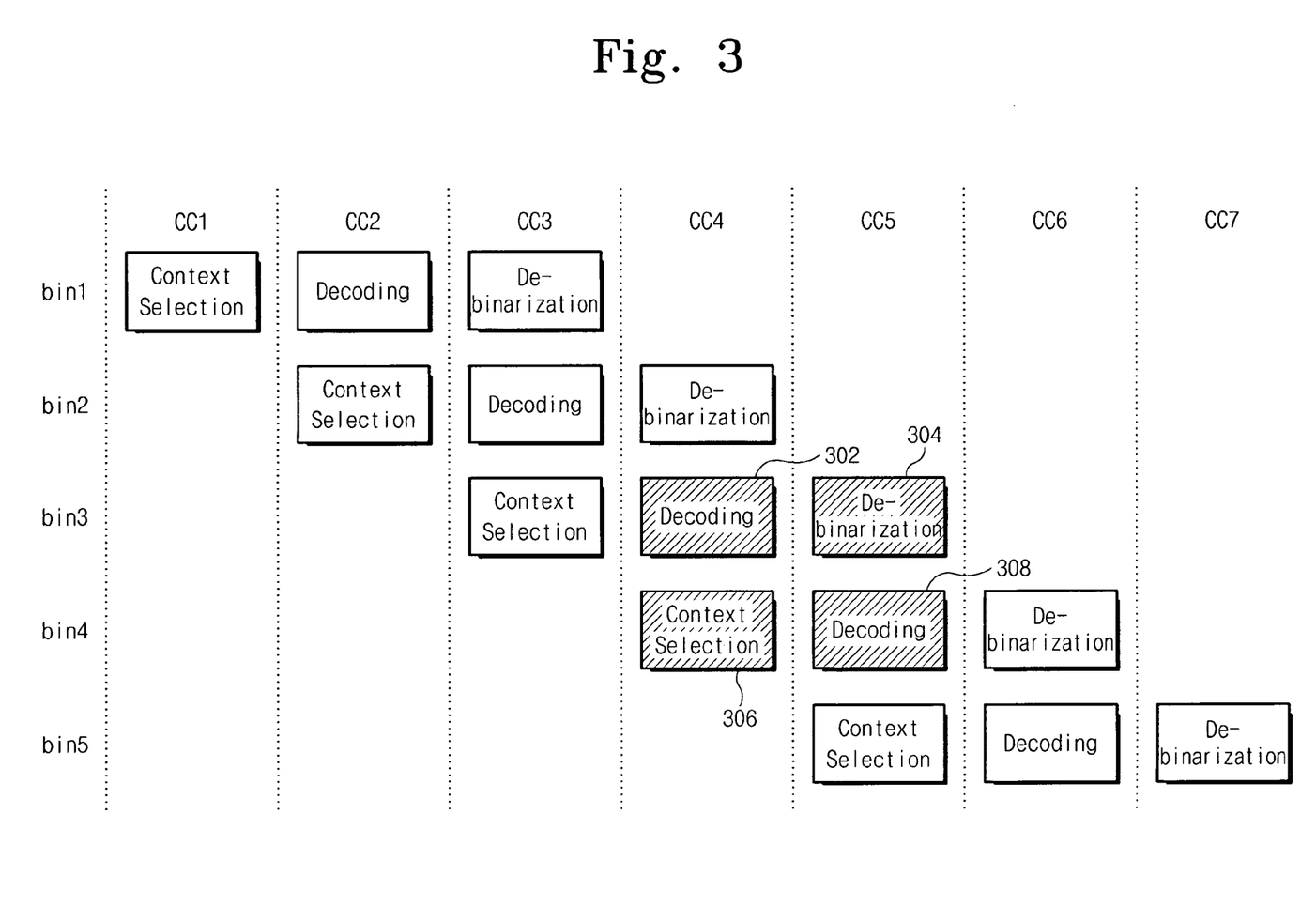
FIG. 3 is a diagram illustrating a CABAC decoding process based on a pipeline scheme according to some embodiments of the present invention.

FIG. 3 is a diagram illustrating a pipelined CABAC decoding process according to some embodiments of the present invention. In the illustrated embodiments, context selection and de-binarization for successive bits may be performed in parallel, e.g., such that de-binarization for a first bit bin1 occurs simultaneously with and/or after context selection and/or decoding of a second bit bin2 commences. More specifically, in a first clock cycle CC1, a context is chosen for a first bit bin1. In a second clock cycle CC2, the first bit bin1 is decoded using the context of the first clock cycle CC1. In the second clock cycle CC2, a context is chosen for a second bit bin2. A de-binarization for the first bit bin1, a decoding operation for the second bit bin2, and a context selection for a third bit are all performed in a third clock cycle CC3.

In the illustrated embodiments, at least two of context selection, 1-bit decoding, and de-binarization for multiple bits are performed in the same clock cycle. Increased speed may be achieved using such a pipeline scheme. However, it may not be possible to determine if all bits of the corresponding syntax element are decoded before a de-binarization for a current one bit is completed, because syntax elements generally have variable lengths. Therefore, in a CABAC decoding process using a pipeline scheme as shown in FIG. 3, an error may occur when a bit belonging to a next syntax element is decoded with a wrong context selection. For example, supposing that the third bit bin3 is the last bit of a syntax element, a context selection for a fourth bit bin4 should use a context for a new syntax element. However, in a CABAC decoding using a pipeline scheme as shown in FIG. 3, a context selection for the fourth bit bin4 occurs before de-binarization for the third bit bin3 is completed, i.e., the context selection is performed based on an assumption that the third bit bin3 and the fourth bit bin4 belong to the same syntax element. This causes an error in that the fourth bit bin4, which is a first bit of the next syntax element, as it is decoded using the wrong context. If left unaddressed, this error could lead to an incorrect update of the context, leading to decoding errors for subsequent bits.

Figure 4:
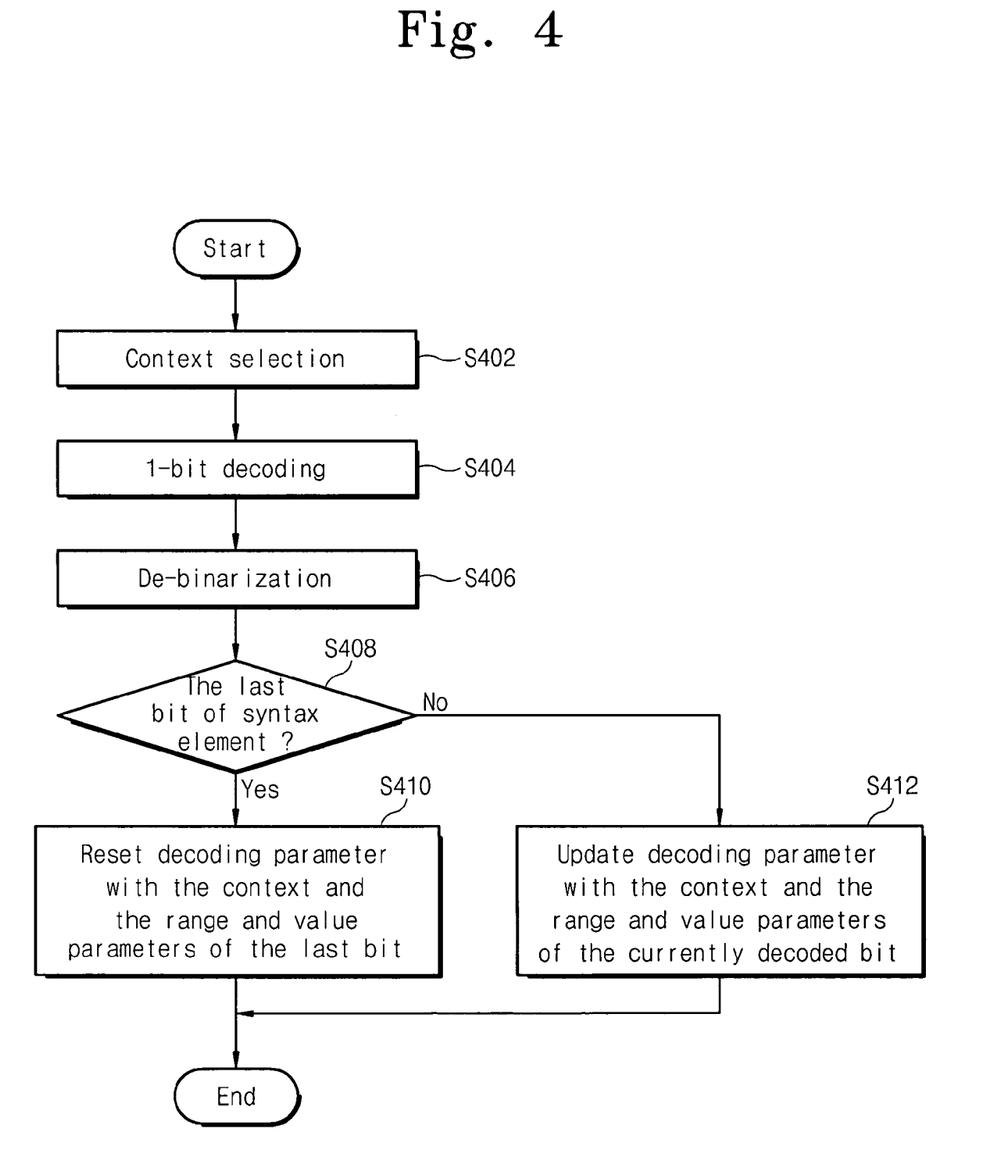
FIG. 4 is a flowchart illustrating a decoding process according to further embodiments of the present invention.

FIG. 4 is a flowchart illustrating a decoding process according to some embodiments of present invention. As shown in FIG. 4, when a de-binarization for a last bit of a syntax element is completed, decoding parameters are updated with the decoding results for the this bit so as to avoid the above-described error. For example, referring to FIG. 3, when a de-binarization for the third bit bin3 is completed, decoding parameters, which have already generated in decoding for the fourth bit bin4 are disregarded in subsequent decoding. The decoding parameters for the third bit bin3, which may be stored in a register of a CABAC decoder, may be used instead to avoid a context update error.

Hereinafter, a CABAC decoding process according to some embodiments of the present invention will described with reference to FIG. 4. A context selection step S402, a 1-bit decoding step S404, and a de-binarization step S406 may be substantially the same as counterpart steps described above with reference to FIG. 2, and further description thereof will be omitted. According to the illustrated embodiments of the present invention, the above steps are performed bitwise using a pipeline scheme as shown in FIG. 3. When a de-binarization for a bit is completed, a determination of whether the bit is the last bit of a syntax element is performed (S408). If the bit is the last bit of a syntax element, then the decoding parameters generated in the decoding process for the next bit, i.e., the first bit of a next syntax element, are ignored, and decoding parameters of a decoder are reset with a context and parameters of range and value generated for the last bit of the syntax element (S410). If the bit is not the last bit of a syntax element, then decoding parameters of a decoder are updated with a context and decoding interval parameters (e.g., range and value parameters) generated for the currently decoded bit (S412).

Figure 5:
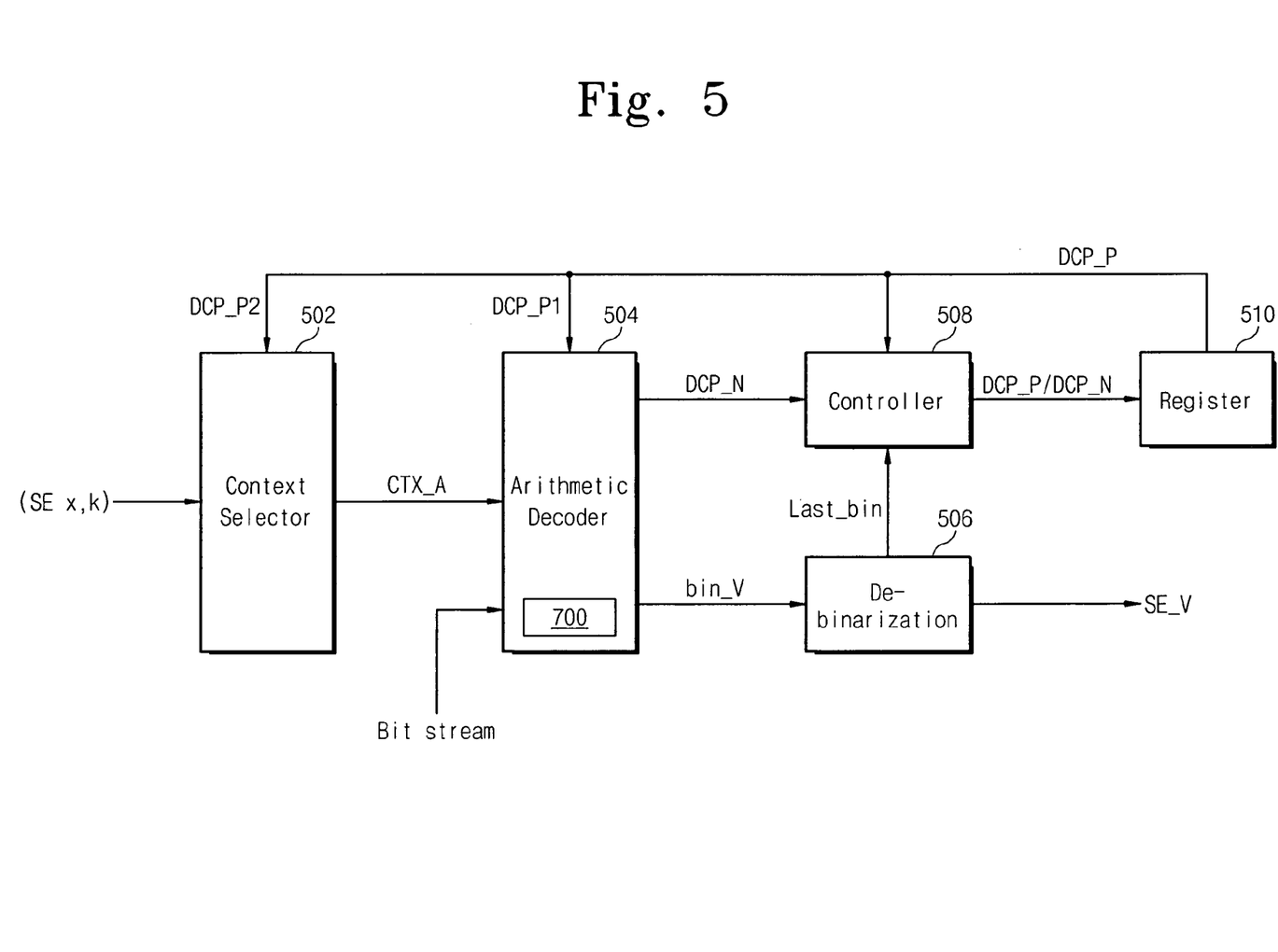
FIGS. 5 and 6 are schematic diagrams of a CABAC decoder according to further embodiments of the present invention.

FIG. 5 is a block diagram of a decoder configured to perform the decoding process illustrated in FIG. 4 according to further embodiments of the present invention. A CABAC decoder includes a context selector 502, an arithmetic decoder 504, a de-binarizer 506, a controller 508, and a register 510, wherein the context selector 502, the arithmetic decoder 504, and the de-binarizer 506 are configured in a pipeline. The context selector 502 selects one CTX_A of a plurality of contexts stored in a internal memory thereof according to a syntax element indicator signal SE x, a bit index signal k, and decoding parameters DCP_P2 of a set of decoding parameters DCP_P generated by decoding a previous bit. The syntax element indicator signal SE x and the bit index signal k are provided once per cycle. The context selector 502 transmits the selected context to the arithmetic decoder 504.

The arithmetic decoder 504 performs a 1-bit decoding for bit stream input from an external stream buffer by using the context CTX_A input from the context selector 502. The arithmetic decoder 504 outputs decoded binary values bin_v to the de-binarizer 506, and outputs decoding parameters DCP_N generated in the decoding process to the controller 508. The arithmetic decoder 504 performs a decoding for a current bit by using decoding parameters DCP_P1 of the set of decoding parameters DCP_P generated for a previously decoded bit.

The de-binarizer 506 de-binarizes the binary values bin_v input from the arithmetic decoder 504, and produces restored syntax elements SE_V. During the de-binarization by the de-binarizer 506, it is determined whether a bit is the last bit of a syntax element. The de-binarizer 506 generates a last bit indicator signal Last_bin indicating whether a bit, which is being de-binarized, is the last bit of a syntax element.

The controller 508 responds to the last bit indicator signal Last_bin from the de-binarizer 506, selecting one from among the two decoding parameter sets DCP_N and DCP_P, and storing the selected parameter set to the register 510. The decoding parameter set DCP_N is input from the arithmetic decoder 504, and the other decoding parameter set DCP_P is the parameter set generated for the previous bit.

The controller 508 determines if the bit currently being de-binarized is the last bit of a syntax element based on the last bit indicator signal Last_bin and, if so, stores the decoding parameters of the preceding bit in the register 510. If the bit currently being de-binarized is not the last bit of a syntax element, new decoding parameters DCP_N input from the arithmetic decoder 504 are stored in the register 510. The decoding parameters DCP_P2, which is input from the register 510 to the context selector 502, may include a context and a context index of the previous bit, and the decoding parameters DCP_P1, which is input from the register 510 to the arithmetic decoder 504, may be decoding interval parameters, e.g., range and value parameters used in the arithmetic decoding process.

Figure 6:
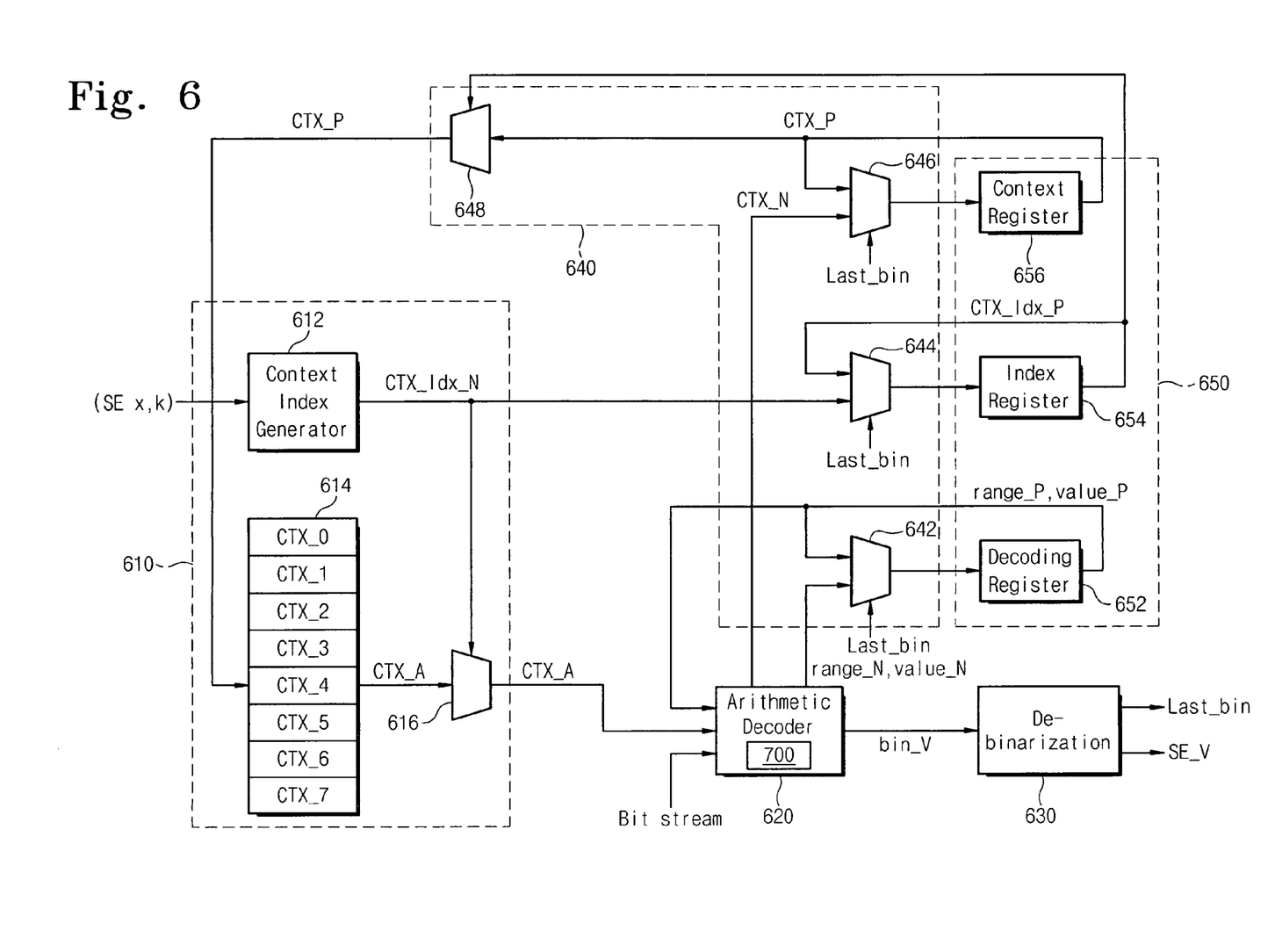

FIG. 6 is a detailed diagram of a decoder configured to perform the decoding process illustrated in FIG. 4 according to some embodiments of the present invention. The decoder shown in FIG. 6 includes a context selector 610, an arithmetic decoder 620, a de-binarizer 630, a controller 640, and a register 650. The context selector 610 includes a context index generator 612, a plurality of context storage registers 614, and a first control circuit 616. The context index generator 612 generates a context index CTX_Idx for a current bit according to a syntax element value SE x and a bit index k, each of which are externally supplied once per cycle. Pluralities of contexts are stored in the registers 614. The first control circuit 616 inputs a context CTX_A selected from the registers 614 to the arithmetic decoder 620 according to the generated context index CTX_Idx_N. The first control circuit 616 may include a multiplexer (MUX) circuit.

The arithmetic decoder 620 decodes compressed data in a bit stream one bit per cycle by using the contexts input from the context selector 610 and decoding range and value parameters range_P and value_P for the previous bit input stored in a decoding interval parameter register 652 of the register 650. The arithmetic decoder 620 provides a decoded binary value bin_V to the de-binarizer 630. The arithmetic decoder 620 generates a new context CTX_N and new range and value parameters range_N and value_N generating in decoding for a current bit by using the context CTX_A from the context selector 610 and range and value parameters range_P and value_P generated for the previous bit.

In FIGS. 5 and 6, the arithmetic decoders 504 and 620 may use a conventional 1-bit decoding process described by the following operational pseudo-code:

Modified_QM Coder_decoder(state, MPS, range, value)

Set bit=MPS (1)

Set rLPS=rLPS_table__64×4[state][(range>>6)&3] (2)

Set range=range−rLPS (3)

if value<range then Set state=AC_next_state_MPS__64[state] (4)

else Set value=value−range
Set range=rLPS, Set bit=!bit
if state==0 then Set MPS=1−MPS
Set state=AC_next_state_LPS_64[state]

$$\text{Set while range} \leq 2^{b-2} \text{ do} \tag{5}$$

Set range=2*range and value=2*value+read_one_bit( ), where range and value are arithmetic decoding interval parameters.

The operation (5) in the above program corresponds to a re-normalization operation, which can cause a varying increase in total operational time due to its variable frequency of occurrence, as described above. The re-normalization operation of the operation (5) may be repeated variable times until the condition of 'while' statement in the operation (5) is satisfied.

Such a time delay may be decreased if the operation (5) is performed without a 'while' condition. Potential substitutes for the operation (5) that do not use such a "while" construction are shown below:

$$x = \log_2(2^{b-2}/\text{range}) + 1 = b - 1 - \text{round}(\log_2 \text{range}) \tag{5-1}$$

range=range<<x and value<<x+read_x_bit( ), where the symbol<<denotes a shift and read_x_bit corresponds to the input bitstream being decoded. (5-2)

In these operations, b is a constant, and x is shift in an input range parameter when 1 appears only once in b-1 least significant bits in the range. The operation (5-1) includes log and division operations, and may be difficult to implement in hardware.

Figure 7:
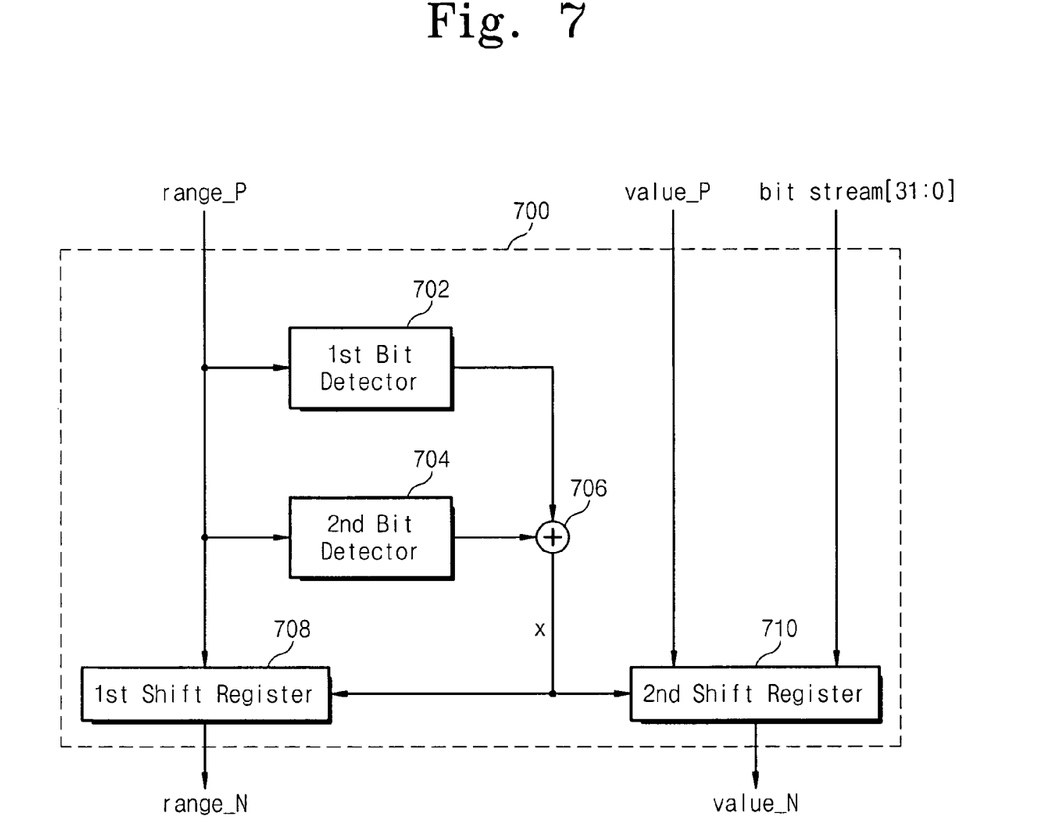
FIG. 7 is a schematic diagram of a re-normalizer for use in the arithmetic decoder illustrated in FIGS. 5 and 6 according to some embodiments of the present invention.

FIG. 7 is an example of a re-normalizer 700 that may be used for a re-normalization operation in the arithmetic decoder illustrated in FIGS. 5 and 6. Referring to FIG. 7, the re-normalizer 700 includes a first bit detector 702, a second bit detector 704, an adder 706, a first shift register 708, and a second shift register 710. The first bit detector 702 outputs a "1" when "1" appears only once below the $b^{th}$ bit in a range parameter range_P of the previous bit input from the register, and outputs a "0" when "1" appears more than once. This may be obtained by AND and OR operations on a range parameter range_P of the previous bit. The first bit detector 702 may be implemented by using an AND gate and an OR gate (not shown). The second bit detector 704 generates a signal indicated at which bit position a first-appearing "1" in a range parameter range_P of the previous bit occurs. The second bit detector 704 may be implemented using a priority encoder.

The adder 706 adds the outputs of the first bit detector 702 and the second bit detector 704. The output of the adder 706 corresponds to x in the above equations. The first shift register 708 outputs a new range parameter range_N, which is generated by shifting a range parameter range_P of the previous bit input from the register to the left by the output x of the adder 706. The second shift register 710 generates a new value parameter value_N by shifting a value parameter value_P of the previous bit input from the register and the input bit stream bit stream[31:0] to the left by the output x of the adder 706.

As described above, the re-normalizer 700 generates new range and value parameters range_N and value_N by using range and value parameters of the previous bit. The re-normalizer 700 does not require repeated shifting operations as required under the operation (5) described above. By using the hardware configuration shown in FIG. 7, a re-normalization process may be completed in one cycle, which can thereby decrease delay. The other operations of the arithmetic decoder may follow the H.264 standard, so the detailed description thereof is omitted.

Referring again to FIG. 6, the de-binarizer 630 restores an original syntax element SE_V by using decoded binary values bin_v generated by the arithmetic decoder 620, determines if an input binary value bin_v is the last bit of a syntax element, and generates a last bit indicator signal Last_bin for selection of a context selection and decoding interval parameters. The controller 640 selects decoding parameters and stores them in the register 650. The parameters are selected from two sets of parameters, the parameters of the previous bit CTX_P, CTX_Idx_P, range_P, and value_P input from the register 650, and the parameters of the current bit CTX_N, CTX_Idx_N, range_N, and value_N input from the arithmetic decoder 620 and the context selector 610. The context of the previous bit CTX_P is also input to the context selector 610 according to the context index of the previous bit CTX_Idx_P input from the register 650.

As shown, the controller 640 may include MUX circuits 642, 644, 646, and 648. The first MUX circuit 642 of the controller 640 selects a set of decoding interval parameters according to the last bit indicator signal Last_bin, and inputs them into a the decoding interval parameter register 652. The stored decoding interval parameters are selected from among two sets of parameters, the decoding interval parameters for the previous bit, range_P and value_P, provided from the decoding interval parameter register 652, and the decoding interval parameters for the current bit, range_N and value_N, input from the arithmetic decoder 620. If the bit currently being de-binarized is the last bit of a syntax element, the first MUX circuit 642 updates the decoding register 652 with the range and value parameters of the previous bit range_P and value_P input from the decoding interval parameter register 652. If the bit currently being de-binarized is not the last bit of a syntax element, the first MUX circuit 642 retains the range and value parameters of the current bit, range_N and value_N, in the decoding interval parameter register 652.

The second MUX circuit 644 of the controller 640 selects a context index according to the last bit indicator signal Last_bin, and stores the selected context index in a context index register 654. The context index is selected from among the context index of the previous bit CTX_Idx_P from the context index register 654 and the context index of the current bit CTX_Idx_N from the context selector 610. If the bit currently being de-binarized is the last bit of a syntax element, the second MUX circuit 644 resets the index register 654 with the context index of the previous bit CTX_Idx_P input from the index register 654 in the context index register 654. If the bit currently being de-binarized is not the last bit of a syntax element, the second MUX circuit 642 stores the context index of the current bit CTX_Idx_N in the context index register 654.

The third MUX circuit of the controller 640 selects a context responsive to the last bit indicator signal Last_bin from the de-binarizer 630, and stores the selected context in a context register 656. The context is selected from among the context of the previous bit CTX_P from the context register 656 and the context of the current bit CTX_N from the arithmetic decoder 620. If the bit currently being de-binarized is the last bit of a syntax element, the third MUX circuit 646 resets the context register 656 with the context of the previous bit CTX_P input from the context register 656. If the bit currently being de-binarized is not the last bit of a syntax element, the third MUX circuit 646 stores the context of the current bit CTX_N to the context register 656. The fourth MUX circuit 648 of the controller 640 provides the context from the context register 656 to the context selector 610 according to the context index stored in the context index register 654.

As described above, the register 650 includes a plurality of registers, in each of which decoding parameters of the previous bit and the current bit are stored respectively. The register 650 includes a decoding interval parameter register 652, a context index register 654, and a context register 656. The decoding interval parameter register 652 stores decoding interval parameters input from the first MUX circuit 642 of the controller 640, and outputs the stored decoding interval parameters to the arithmetic decoder 620 and the controller 640. The context index register 654 stores a context index input from the second MUX circuit 644 of the controller 640, and outputs the stored context index to the second and the fourth MUX circuits 644 and 648. The context register 656 stores a context input from the third MUX circuit 646, and outputs the stored context to the third and the fourth MUX circuits 646 and 648.

In the H.264/AVC standard, when the probabilities of "Most Probable Symbol" (MPS) and "Least Probable Symbol" (LPS) are the same, a binary arithmetic decoding process may be performed (e.g., in a "bypass decoding" mode) without a context selection process. Therefore, it is possible to decode plural bits at a time. Furthermore, in a bypass-decoding mode, as the binarization scheme for encoding employs exponential Golomb (Exp-Golomb) codes, plural bits can be simultaneously de-binarized. Embodiments of the present invention can be applied to a bypass decoder. That is, plural bits can be decoded in a cycle by updating range and value parameters for the last bit and changing bit offset read out from a strip buffer when the last bit of a syntax element is decoded.

Figure 8:
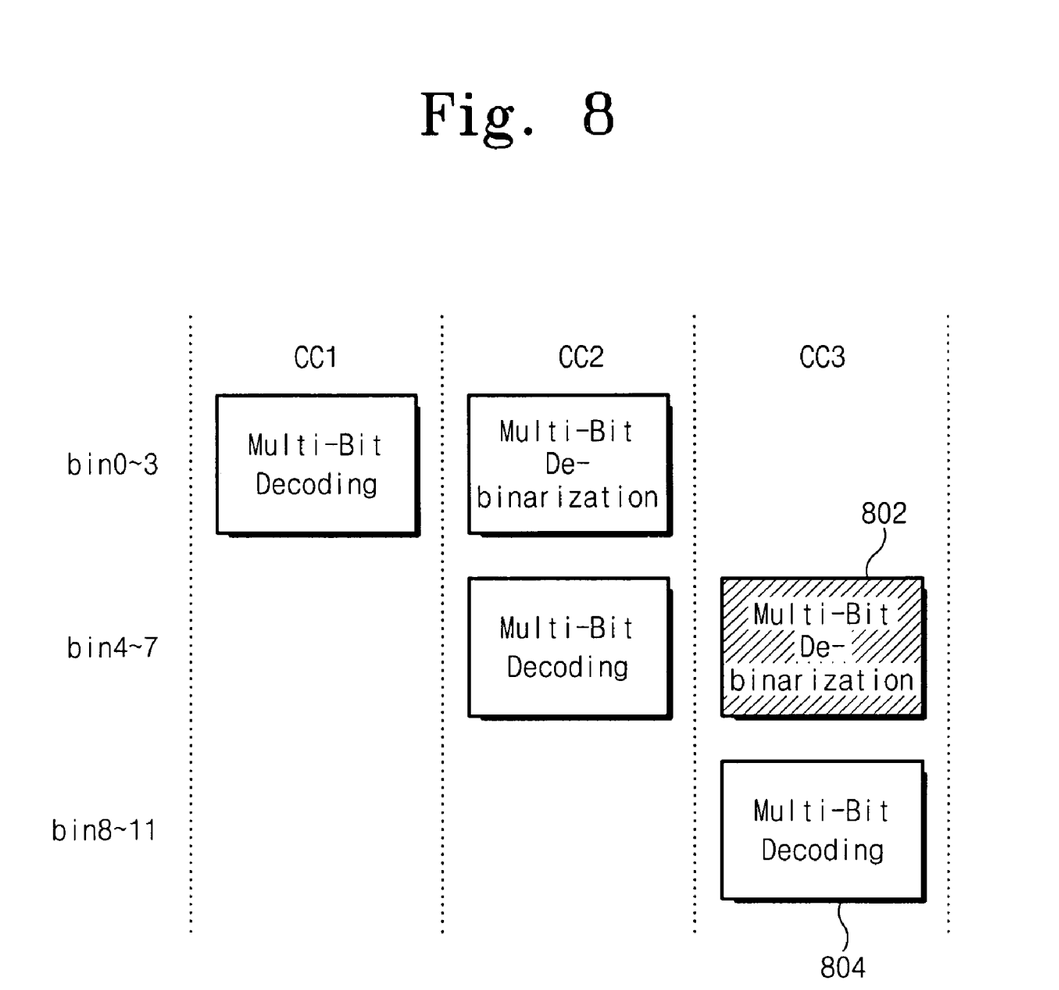
FIG. 8 illustrates a decoding process including simultaneous decoding and de-binarization of multiple bits according to some embodiments of the present invention.

FIG. 8 illustrates an exemplary decoding process in a binary arithmetic decoder according to some embodiments of the present invention. As shown in FIG. 8, first and second pluralities of four bits each are decoded and de-binarized in parallel. Similar to the operations described above with reference to FIGS. 3-6, decoding errors arising from decoding bits belonging to other syntax elements can be prevented by detecting the last bit of a syntax element among the four bits which are being de-binarized and updating decoding parameters with the decoding parameters of the last bit so that the decoding parameters of the last bit are used for the first bit of the subsequent syntax element.

Figure 9:
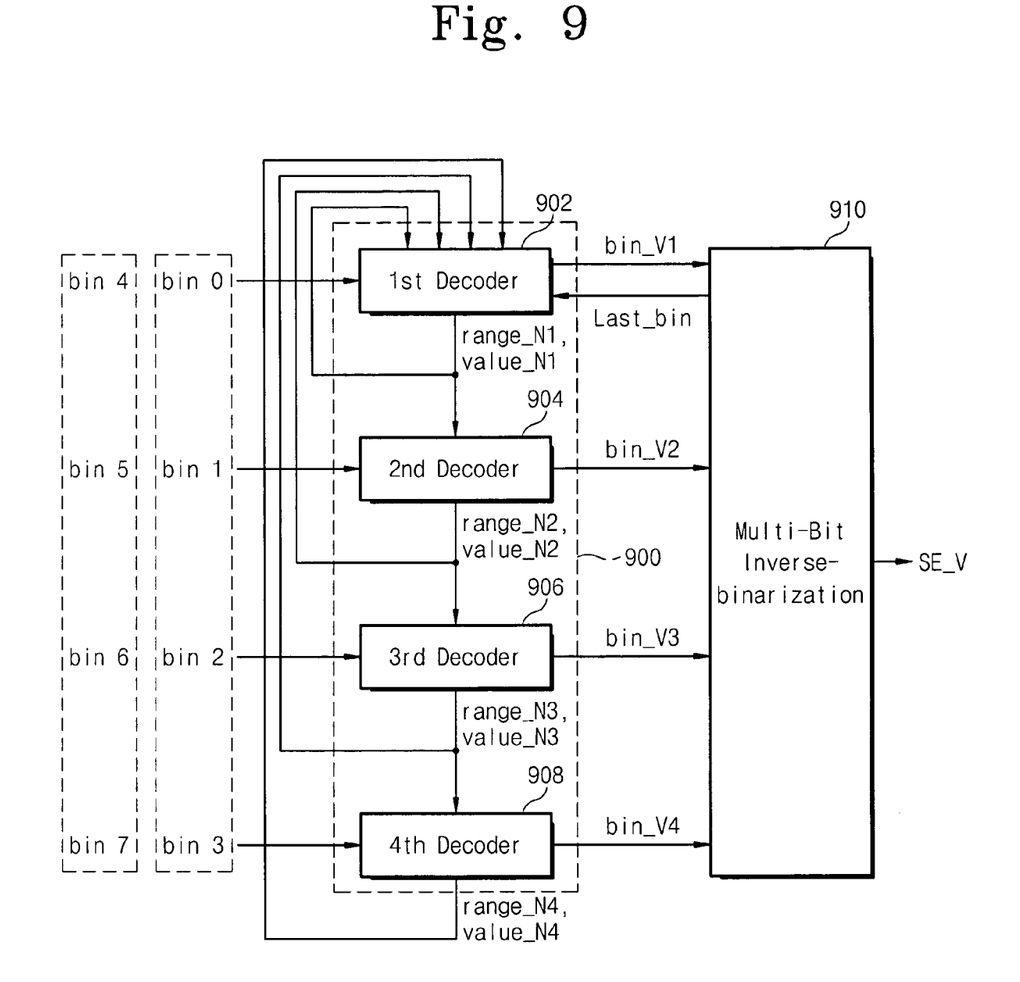
FIG. 9 illustrates an example of an arithmetic decoder configured to simultaneously decode and de-binarize pluralities of bits according to further embodiments of the present invention.

FIG. 9 illustrates an example of a multi-bit decoder 900 that decodes and de-binarizes first and second pluralities of bits in parallel, along the lines shown in FIG. 8. The multi-bit decoder includes a decoder 900 and a de-binarizer 910. The decoder 900 includes a chain of four arithmetic decoders 902, 904, 906, and 908. The first decoder 902 decodes bits bin0, bin4, . . . , the second decoder 904 decodes bits bin1, bin5, . . . , the third decoder 906 decodes bits bin2, bin6, . . . , and the fourth decoder 908 decodes bits bin3, bin7, . . . . The first decoder 902 provides decoded binary values bin_v1 to the multi-bit de-binarizer 910, and also provides decoding range and value parameters range_N1 and value_N1 that are generated in the decoding process to the second decoder 904. The second decoder 904 decodes using the decoding parameters range_N1 and value_N1 input from the first decoder 902, outputs decoded binary values bin_v2 to the multi-bit de-binarizer 910, and provides decoding range and value parameters range_N2 and value_N2 that are generated in the decoding process to the third decoder 906.

The third decoder 906 decodes using the decoding parameters range_N2 and value_N2 input from the second decoder 904, provides decoded binary values bin_v3 to the multi-bit de-binarizer 910, and outputs decoding range and value parameters range_N3 and value_N3, which are generated in the decoding process to the fourth decoder 908. The fourth decoder 908 decodes using the decoding parameters range_N3 and value_N3 input from the third decoder 906, outputs decoded binary values bin_v4 to the multi-bit de-binarizer 910, and outputs decoding range and value parameters range_N4 and value_N4 which are generated in the decoding process to the first decoder 902. The decoding operations of the first to the fourth decoder 902, 904, 906, and 908 may be performed in one clock cycle in a bypass mode using relative simple operational equations and fast computation techniques.

The multi-bit de-binarizer 910 de-binarizes the decoded binary values bin_v1, bin_v2, bin_v3, and bin_v4 output from the first, second, third and fourth decoders 902, 904, 906, and 908, and generates the corresponding syntax element. The multi-bit de-binarizer 910 also determines if any of the decoded binary values from the first to fourth decoders is the last bit of a syntax element, and generates a last bit indicator signal Last_bin to the first decoder 902, which responsively disregards decoding parameters generated for bits following the last bit. For example, if the third bit bin_v3 is the last bit of the corresponding syntax element, the decoding range and value parameters range_N3 and value_N3 output from the third decoder 906 are used by the first decoder 902, while the decoding range and value parameters range_N4 and value_N4 are disregarded. Through the process described above, the decoding errors for next bits belonging to other syntax elements may be prevented.

As described above, by using binary arithmetic decoders and methods according to various embodiments of the present invention, a re-normalization process can be performed without a comparison operation, and thus time delays in decoding can be decreased. According to further embodiments of the present invention, by decoding and de-binarizing bits in a pipelined fashion, decoding speed can be increased while avoiding decoding errors.

In the drawings and specification, there have been disclosed embodiments of the invention and, although specific terms are employed, they are used in a generic and descriptive sense only and not for purposes of limitation, the scope of the invention being set forth in the following claims.

That which is claimed:

1. A binary arithmetic decoding method comprising:
receiving in a binary arithmetic decoder, a coded bit stream;
generating a first decoded bit and a first set of decoding parameters using a previously generated set of decoding parameters;
generating a second decoded bit and a second set of decoding parameters using the first set of decoding parameters;
determining whether the first decoded bit is a last bit of a syntax element; a~ selecting from among the first set of decoding parameters and the second set of decoding parameters for generation of subsequent decoded bits based on the determination of whether the first decoded bit is a last bit of a syntax element, wherein selecting from among the first set of decoding parameters and the second set of decoding parameters for generation of subsequent decoded bits based on the determination of whether the first decoded bit is a last bit of a syntax element comprises not using a context and a decoding interval determined in generating the second decoded bit in generating the subsequent decoded bits; and
using decoding interval parameters from the first set of decoding parameters to generate a third decoded bit if the first decoded bit is a last bit of a syntax element.

2. A method according to claim 1, wherein the generation of the first and second decoded bits and the determination of whether the first decoded bit is a last bit of a syntax element are pipelined such that the determination of whether the first decoded bit is a last bit of a syntax element occurs concurrent with and/or after generation of the second decoded bit and the second set of decoding parameters.

3. A method according to claim 1, wherein determining whether the first decoded bit is a last bit of a syntax element comprises de-binarizing the first decoded bit.

4. A method according to claim 1, wherein the first and second sets of decoding parameters comprise respective first and second contexts and respective first and second decoding interval parameters.

5. A method according to claim 4, wherein the first and second decoding interval parameters comprise respective first and second sets of value and range parameters.

6. A method according to claim 5, wherein generating a first decoded bit and a first set of decoding parameters using a previously generated set of decoding parameters and/or generating a second decoded bit and a second set of decoding parameters using the first set of decoding parameters comprises re-normalizing the first set of range and value parameters and/or the second set of range and value parameters.

7. A method according to claim 6, wherein re-normalizing the first set of range and value parameters and/or the second set of range and value parameters comprises:
generating a first binary value indicative of a number of times a binary "1" in a least significant b bits of a first range parameter;
generating a second binary value indicative of a bit position at which a binary "1" appears with respect to a least significant bit of the first range parameter;
generating a sum of the first and second binary values;
shifting the first range parameter by the sum of the first and second binary values to generate a second range parameter; and
shifting a first value parameter by the sum of the first and second binary values to generate a second value parameter.

8. A method according to claim 1:
wherein generating a first decoded bit and a first set of decoding parameters using a previously generated set of decoding parameters comprises generating a first plurality of decoded bits and a first plurality of sets of decoding parameters;
wherein generating a second decoded bit and a second set of decoding parameters using the first set of decoding parameters comprises generating a second plurality of decoded bits and a second plurality of sets of decoding parameters;
wherein determining whether the first decoded bit is a last bit of a syntax element comprises determining whether one of the first plurality of decoded bits is a last bit of a syntax element; and
wherein selecting from among the first set of decoding parameters and the second set of decoding parameters for generation of subsequent decoded bits based on the determination of whether the first decoded bit is a last bit of a syntax element comprises disregarding at least one of the second plurality of sets of decoding parameters in generating subsequent decoded bits if the one of the first plurality of decoded bits is a last bit of a syntax element.

9. A method according to claim 8, wherein the generation of the first and second pluralities of decoded bits and the determination of whether one of the first plurality of decoded bits is a last bit of a syntax element are pipelined such that the determination of whether one of the first plurality of decoded bits is a last bit of a syntax element occurs concurrent with and/or after generation of the second plurality of decoded bits and the second plurality of sets of decoding parameters.

10. A method according to claim 9, wherein the sets of decoding parameters each comprise a decoding interval parameter.

11. A method according to claim 10, wherein the sets of decoding parameters each include a value parameter and a range parameter.

12. A method according to claim 8, wherein the sets of decoding parameters do not include contexts.

13. A method according to claim 1, further comprising recovering the syntax element from the first decoded bit.

14. An apparatus comprising:
a binary arithmetic decoder configured to recover syntax elements from a coded bitstream, the binary arithmetic decoder configured to generate a first decoded bit and a corresponding set of decoding parameters using a previously generated set of decoding parameters and to generate a second decoded bit and a corresponding second set of decoding parameters using the first set of decoding parameters, the binary arithmetic decoder further configured to determine whether the first decoded bit is a last bit of a syntax element and to select from among the first set of decoding parameters and the second set of decoding parameters for generation of subsequent decoded bits based on the determination of whether the first decoded bit is a last bit of a syntax element, wherein the binary arithmetic decoder comprises a context-adaptive binary arithmetic coding (CABAC) decoder configured to not use a context and a decoding interval determined in generating the second decoded bit in generating the subsequent decoded bits if the first decoded bit is a last bit of a syntax element and wherein the CABAC decoder is further configured to use decoding interval parameters from the first set of decoding parameters to generate a third decoded bit if the first decoded bit is a last bit of a syntax element.

15. An apparatus according to claim 14, wherein the binary arithmetic decoder is configured to generate the first and second decoded bits and to determine whether the first decoded bit is a last bit of a syntax element in a pipelined fashion such that the determination of whether the first decoded bit is a last bit of a syntax element occurs concurrent with and/or after generation of the second decoded bit and the second set of decoding parameters.

16. An apparatus according to claim 14, wherein the first and second sets of decoding parameters comprise respective first and second decoding contexts and respective first and second decoding interval parameters.

17. An apparatus according to claim 16, wherein the CABAC decoder comprises:
a register configured to store contexts and decoding interval parameters;
a context selector configured to receive contexts from the register, to store the received contexts and to select from among the stored contexts responsive to a syntax element indicator signal;
an arithmetic decoder configured to receive the selected contexts from the context selector and decoding interval parameters from the register, to receive a data stream and generate decoded bits therefrom according to the selected contexts and the received decoding interval parameters and to generate respective sets including a context and a decoding interval parameter for the respective decoded bits;

a de-binarizer configured to receive the decoded bits, to convert the decoded bits to syntax elements, and to generate a last bit indicator signal indicative of whether a decoded bit is a last bit of a syntax element; and a controller configured to receive the generated sets of a context and a decoding interval parameter for the respective decoded bits and the last bit indicator signal and to selectively store the contexts and decoding interval parameters in the register responsive to the last bit indicator signal.

18. An apparatus according to claim 17, wherein the first and second sets of decoding parameters comprise respective first and second sets of range and value parameters, and wherein the arithmetic decoder comprises a re-normalizer configured to re-normalize the first set of range and value parameters and/or the second set of range and value parameters.

19. An apparatus method according to claim 18, wherein the re-normalizer comprises:
 a first detector configured to generate a first binary value indicative of a number of times a binary "1" occurs in a least significant b bits of a first range parameter;
 a second detector configured to generate a second binary value indicative of a bit position at which a binary "1" appears with respect to a least significant bit of the first range parameter;
 an adder configured to generate a sum of the first and second binary values;
 a first shift register configured to shift the first range parameter by the sum of the first and second binary values to generate a second range parameter; and
 a second shift register con figured to shift a first value parameter by the sum of the first and second binary values to generate a second value parameter.

20. An apparatus according to claim 19, wherein the re-normalizer generates the second range parameter and the second value parameter by shifting the first range parameter and the first value parameter x bits according to the relation:

$$x=\log_2(2^{b-2}/\text{range})+1=b-1-\text{round}(\log_2 \text{range}),$$

wherein b is a constant and range is the first range parameter.

21. An apparatus according to claim 17:
 wherein the context selector is configured to generate a first context index responsive to a first syntax element indicator signal and to generate a second context index responsive to a second syntax element indicator signal;
 wherein the controller is configured to selectively provide the first context index or the second context index to the register responsive to the last bit indicator signal;
 wherein the arithmetic decoder is configured to generate a first context and a first set of decoding interval parameters for the first decoded bit and to generate a second context and a second set of decoding interval parameters for the second decoded bit;
 wherein the register comprises:
  a decoding interval register configured to store decoding interval parameters received from the controller and to provide the stored decoding interval parameters to the arithmetic decoder;
  a context register configure to store a context received from the controller; and
  a context index register configured to store a context index received from the controller;
 wherein the controller comprises:
  a first control circuit configured to store one of the first set of decoding interval parameters or the second set of decoding interval parameters in the decoding interval register responsive to the last bit indicator signal;
  a second control circuit configured to store one of the first context or the second context in the context register responsive to the last bit indicator signal;
  a third control circuit configured to store one of the first context index or the second context index in the context register responsive to the last bit indicator signal; and
  a fourth control circuit configured to provide the selected context to a context storage location of the context selector according to the context index stored in the context index register.

22. An apparatus according to claim 14, wherein the binary arithmetic decoder is configured to generate a first plurality of decoded bits and a corresponding first plurality of sets of decoding parameters and to generate a second plurality of decoded bits and a corresponding second set of decoding parameters using the first set of decoding parameters, the binary arithmetic decoder further configured to determine whether one of the first plurality of decoded bits is a last bit of a syntax element and to disregard at least one of the second plurality of sets of decoding parameters in generating subsequent decoded bits if the one of the first plurality of decoded bits is a last bit of a syntax element.

23. An apparatus according to claim 22, wherein the binary arithmetic decoder is configured to generate the first and second pluralities of decoded bits and to determine whether one of the first plurality of decoded bits is a last bit of a syntax element in a pipelined fashion such that the determination of whether one of the first plurality of decoded bits is a last bit of a syntax element occurs concurrent with and/or after generation of the second plurality of decoded bits and the second plurality of sets of decoding parameters.

24. An apparatus according to claim 22, where the sets of decoding parameters each comprise decoding interval parameters.

25. An apparatus according to claim 24, wherein the sets of decoding parameters each include a value parameter and a range parameter.

26. An apparatus according to claim 22, wherein the sets of decoding parameters do not include contexts.

27. An apparatus according to claim 22, wherein the binary arithmetic decoder comprises:
 a chain of arithmetic decoders, each of which is configured to pass a set of decoding parameters to a next arithmetic decoder of the chain; and
 a multi-bit de-binarizer configured to receive a plurality of decoded bits from the chain of arithmetic decoders.

28. An apparatus according to claim 27, wherein the chain of arithmetic decoders and the multi-bit de-binarizer are pipelined such that the first plurality of decoded bits are de-binarized concurrent with and/or after generation of the second plurality of decoded bits.

* * * * *